(12) United States Patent
Du

(10) Patent No.: US 8,254,143 B2
(45) Date of Patent: Aug. 28, 2012

(54) BACKPLANE AND COMMUNICATION APPARATUS

(75) Inventor: Yumin Du, Shenzhen (CN)

(73) Assignee: Chengdu Huawei Symantec Technologies Co., Ltd., Chengdu (CN)

( * ) Notice: Subject to any disclaimer, the term of this patent is extended or adjusted under 35 U.S.C. 154(b) by 640 days.

(21) Appl. No.: 12/265,691

(22) Filed: Nov. 5, 2008

(65) Prior Publication Data

US 2009/0182922 A1 Jul. 16, 2009

(30) Foreign Application Priority Data

Jan. 10, 2008 (CN) .......................... 2008 1 0000354

(51) Int. Cl.
*H05K 1/14* (2006.01)
(52) U.S. Cl. .......... 361/784; 361/785; 361/788; 439/43; 439/61
(58) Field of Classification Search .................. 361/788, 361/784, 785, 790–792; 439/61, 65, 544, 439/327, 796, 43
See application file for complete search history.

(56) References Cited

U.S. PATENT DOCUMENTS

| | | | |
|---|---|---|---|
| 6,126,451 A * | 10/2000 | Zandy et al. ................ | 439/61 |
| 6,328,572 B1 | 12/2001 | Higashida et al. | |
| 7,924,826 B1 * | 4/2011 | Muntz et al. ................ | 370/359 |
| 2002/0160743 A1 | 10/2002 | Vianna et al. | |
| 2006/0292898 A1 * | 12/2006 | Meredith et al. ............... | 439/65 |
| 2007/0178718 A1 | 8/2007 | Li et al. | |
| 2009/0088008 A1 * | 4/2009 | Bandholz et al. .............. | 439/73 |

FOREIGN PATENT DOCUMENTS

| | | |
|---|---|---|
| CN | 2671290 Y | 1/2005 |
| DE | 10 2006 013 206 A1 | 9/2007 |
| EP | 1619757 A1 | 1/2006 |
| JP | 62-200789 U | 12/1987 |
| JP | 2000-306636 A | 11/2000 |
| JP | 2001-42981 A | 2/2001 |
| JP | 2004-227866 A1 | 8/2004 |
| JP | 2006-524908 A | 11/2006 |
| JP | 2007-102722 A | 4/2007 |
| WO | 2007/110053 A2 | 10/2007 |

OTHER PUBLICATIONS

Rejection Decision in corresponding Chinese Application No. 200810000354.0 (Apr. 23, 2010).
$2^{nd}$ Office Action in corresponding Japanese Application No. 2008-310036 (Aug. 25, 2011).

* cited by examiner

*Primary Examiner* — Hoa C Nguyen
(74) *Attorney, Agent, or Firm* — Leydig, Voit & Mayer, Ltd.

(57) ABSTRACT

The present invention discloses a communication apparatus. The communication apparatus includes one or more board and a backplane. The board includes a connector and a function processing unit circuit connected to the connector. The backplane includes at least one group of board connectors. Each group of the board connectors includes two board connectors that receive signals from different boards. The board connector includes connection terminals connected to the connector on boards. The two board connectors are distributed up and down, and the connection terminals of the two board connectors are distributed symmetrically around a center. The foregoing communication apparatus and backplane are cost-efficient.

10 Claims, 7 Drawing Sheets

BACKPLANE AND COMMUNICATION APPARATUS

CROSS-REFERENCE TO RELATED APPLICATIONS

This application claims priority to Chinese Patent Application No. 200810000354.0, filed with the Chinese Patent Office on Jan. 10, 2008, which is incorporated herein by reference in its entirety.

FIELD OF THE INVENTION

The present invention relates to communication technologies, and more particularly to a backplane and a communication apparatus.

BACKGROUND OF THE INVENTION

Nowadays, a communication or Internet technology system is generally made up of a backplane and multiple single boards, with the backplane connected to the single boards through connectors, to facilitate management and maintenance. The signal pin of a connector on a backplane or single board is called "terminal". The connector pins on a backplane are vertical to the single backplane, but the single boards have right-angled connectors, which facilitate vertical insertion into the backplane slots. The terminal of each slot on the backplane is fixed. The single boards are inserted into the corresponding backplane slots vertically according to their respective functions and pin assignment. The signals between the boards are connected through the printed wires on the backplane.

Depending on the importance, single boards are categorized into core boards and peripheral boards. A core board is a key component of the system. The core board in a robust system must be backed up for security. The general backup method is: two core boards with the same functions and interfaces are applied to a system. When the system works, the peripheral boards send circuit signals to the two core boards concurrently, receive signals from the two core boards concurrently, and choose to process the signals of a specific core board according to the factors such as signal quality. This function of peripheral boards is called "dual-transmit single-receive" function.

The signal connection between a core board and a peripheral board is generally implemented through backplane wiring. As shown in FIG. 1, a typical system capable of backing up core boards in the related art includes a number of peripheral boards 11 and two identical core boards 12. To implement such a system, the following factors need to be considered.

(1) The pin assignment and the connectors from the active core board to the backplane are the same as those from the standby core board to the backplane.

(2) The slots of the peripheral boards on the backplane may come in many types, depending on the functions; but all types of slots have the same pin layout and pin assignment, and the same connectors.

(3) The pin assignment of the slots of the corresponding peripheral boards on the backplane must cover the signals that come from the two core boards.

(4) The peripheral boards must have the "dual-transmit single-receive" function on the backplane.

As shown in FIG. 2, the layout of a peripheral board and a backplane in the related art includes a backplane 21, and a peripheral board 22. In FIG. 2, a terminal set 25 is a set of terminals connected to the active core board on the peripheral board 22, and corresponds to the terminal set 25' on the backplane 21. A terminal set 26 is a set of terminals connected to the standby core board on the peripheral board 22, and corresponds to the terminal set 26' on the backplane 21. A dual-transmit single-receive unit circuit 23 performs dual-transmit operations for the signals from the function processing unit circuit 24, and selects the signals from the terminal set 25 or 26 and sends the selected signals to the function processing unit circuit 24 for processing. In the practical application, the dotted line box in FIG. 2 may be realized through a chip, but the chip must include a dual-transmit single-receive unit circuit 23 and a function processing unit circuit 24.

However, in certain application environments, some peripheral boards in the system only need to process signals of one core board. That is, some peripheral boards only need to be connected to one of the core boards. A waste of resources arises if a board with a dual-transmit single-receive unit circuit shown in FIG. 2 is further applied. For cost efficiency, the dual-transmit single-receive unit circuit on the peripheral board may be removed, and only the function processing unit circuit needs to be reserved. If the technology is implemented on a single chip, the dual-transmit single-receive processing unit in the chip can be removed to slash the cost of the board.

However, the terminals corresponding to the peripheral board slots on the backplane include both the terminal set 25' connected to the active core board and the terminal set 26' connected to the standby core board. Moreover, the physical arrangement and the pin assignment of the terminals are fixed. As shown in FIG. 2, if a peripheral board 22 is connected to each core board through n signal lines, the function processing unit circuit 24 is connected to the dual-transmit single-receive unit circuit 23 also through n signal lines. If the function processing unit circuit 24 is reserved, only n signal lines can be led out. About how the peripheral board is connected to n terminals of the fixedly arranged terminal set 25' or 26' on the backplane, the related arts provide the following two methods.

FIG. 3 illustrates the structure of a peripheral board and the corresponding backplane in one method of the related art. The peripheral board 32 includes two function processing unit circuits 33 and 34. The function processing unit circuit 33 processes the signals of the terminal set 35, and the function processing unit circuit 34 processes the signals of the terminal set 36.

During the research and practice of the related art, the inventor finds that: a function processing unit circuit is added on the peripheral board in the solution of the related art, so that the peripheral board can be connected to the fixedly arranged terminal set 35' or terminal set 36' on the backplane as required, however, a function processing unit circuit is generally more expensive than a dual-transmit single-receive unit circuit, so this solution is costly.

FIG. 4A illustrates the structure of a backplane 41 and a peripheral board 42 designed solely processing the signals of the terminal set 44' on the backplane 41 in another method of the related art. FIG. 4B illustrates the structure of a backplane 41 and a peripheral board 42 designed solely for processing the signals of the terminal set 45' on the backplane 41 in another method of the related art. Two boards are designed separately. The peripheral board 42 contains a function processing unit circuit 43 and a terminal set 44. The terminal set 44 is connected to the terminal set 44' on the backplane 41. The function processing unit circuit 43 is designed solely for processing the signals of the terminal set 44' on the backplane. The peripheral board 42' includes a function processing unit circuit 43' and a terminal set 45. The terminal set 45 is connected to the terminal set 45' on the backplane 41, and the function processing unit circuit 43' is designed solely for processing the signals of the terminal set 45'.

During the research and practice of the related art, the inventor finds that: this solution can reduce the cost of the board, but two different boards need to be made, which brings much more cost of development, production and maintenance, on the whole, the solution is still costly.

In a word, the technical solution of the related arts is unable to provide cost efficiency.

SUMMARY OF THE INVENTION

According to embodiments of the present invention, a backplane and a communication apparatus are provided.

A backplane includes at least one group of board connectors. Each group of the board connectors includes two board connectors that receive signals from different boards. The board connector includes connection terminals connected to the connector on boards. The two board connectors are distributed up and down, and the connection terminals of the two board connectors are distributed symmetrically around a center.

A communication apparatus includes one or more board and a backplane. The board includes a connector and a function processing unit circuit connected to the connector. The backplane includes at least one group of board connectors. Each group of the board connectors includes two board connectors that receive signals from different boards. The board connector includes connection terminals connected to the connector on boards. The two board connectors are distributed up and down, and the connection terminals of the two board connectors are distributed symmetrically around a center.

BRIEF DESCRIPTION OF THE DRAWINGS

Embodiments of the present invention will become more fully understood from the detailed description given herein below for illustration only, and thus are not limitative to the present invention.

DETAILED DESCRIPTION OF THE EMBODIMENTS

The present invention is illustrated in detail below by reference to embodiments and the accompanying drawings.

Figure 1:
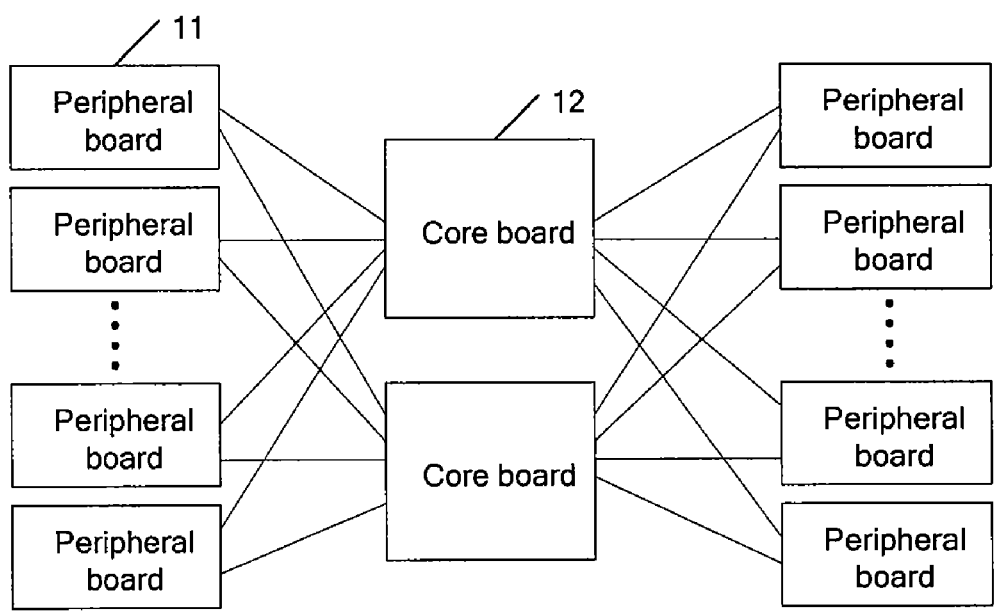
FIG. 1 illustrates the architecture of a typical system capable of backing up core boards in the related art.
Figure 2:
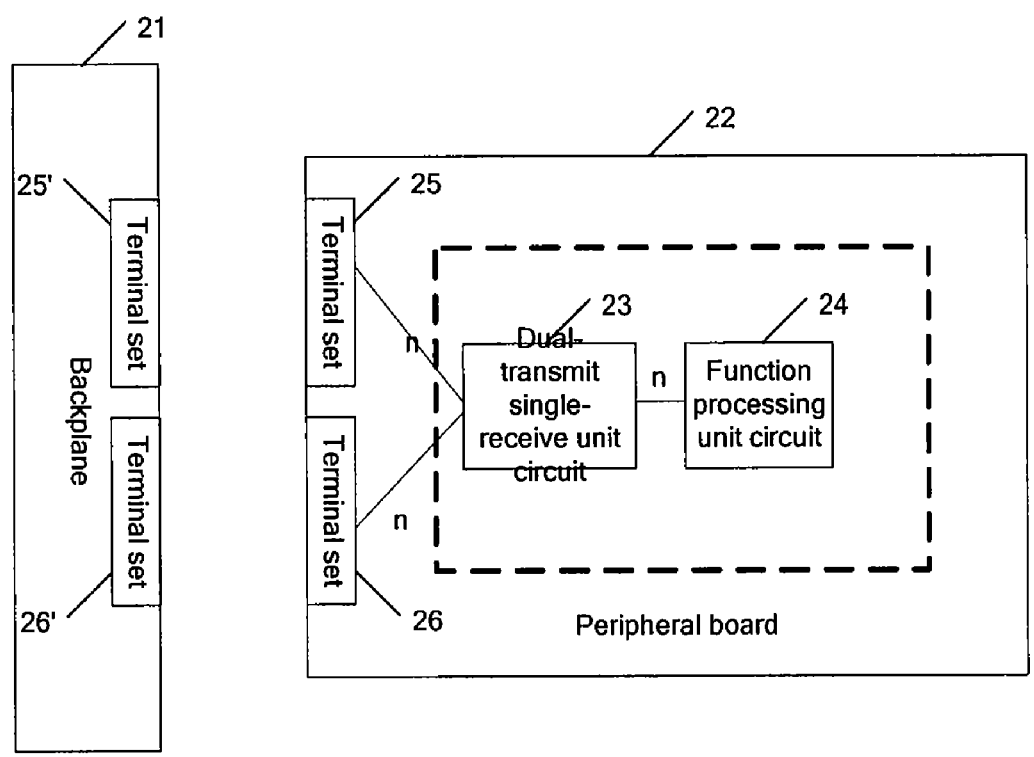
FIG. 2 illustrates the structure of a typical system capable of backing up core boards in the related art.
Figure 3:
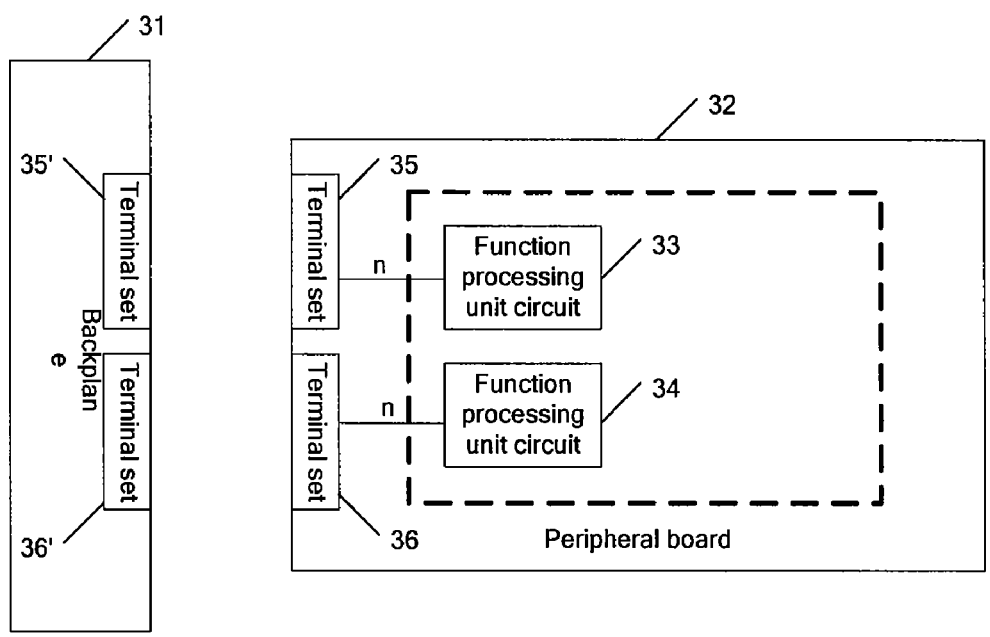
FIG. 3 illustrates the structure of a peripheral board and the corresponding backplane in one method of the related art.
Figure 4A:
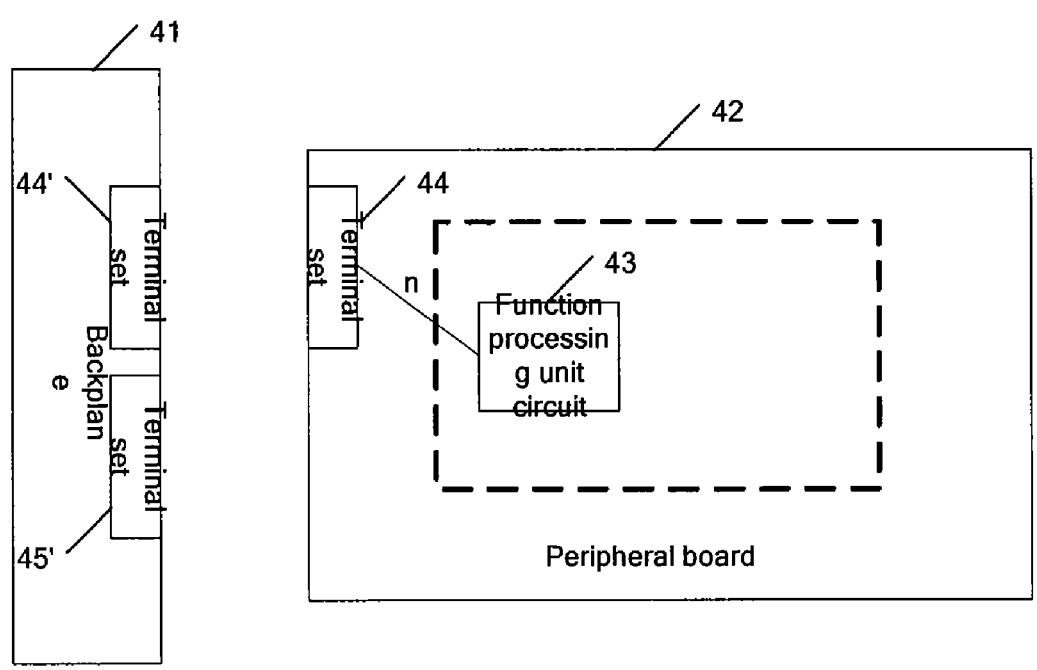
FIG. 4A illustrates the structure of a backplane and a peripheral board designed solely for processing the signals of the terminal set on the backplane in another method of the related art.
Figure 4B:
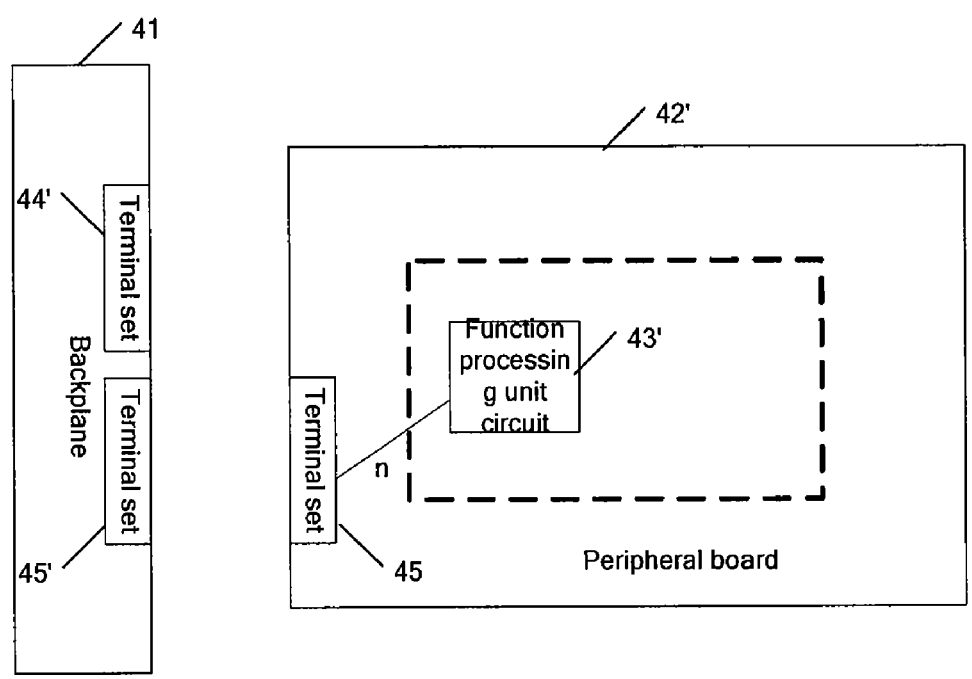
FIG. 4B illustrates the structure of a backplane and a peripheral board designed solely for processing the signals of the terminal set on the backplane in another method of the related art.
Figure 5:
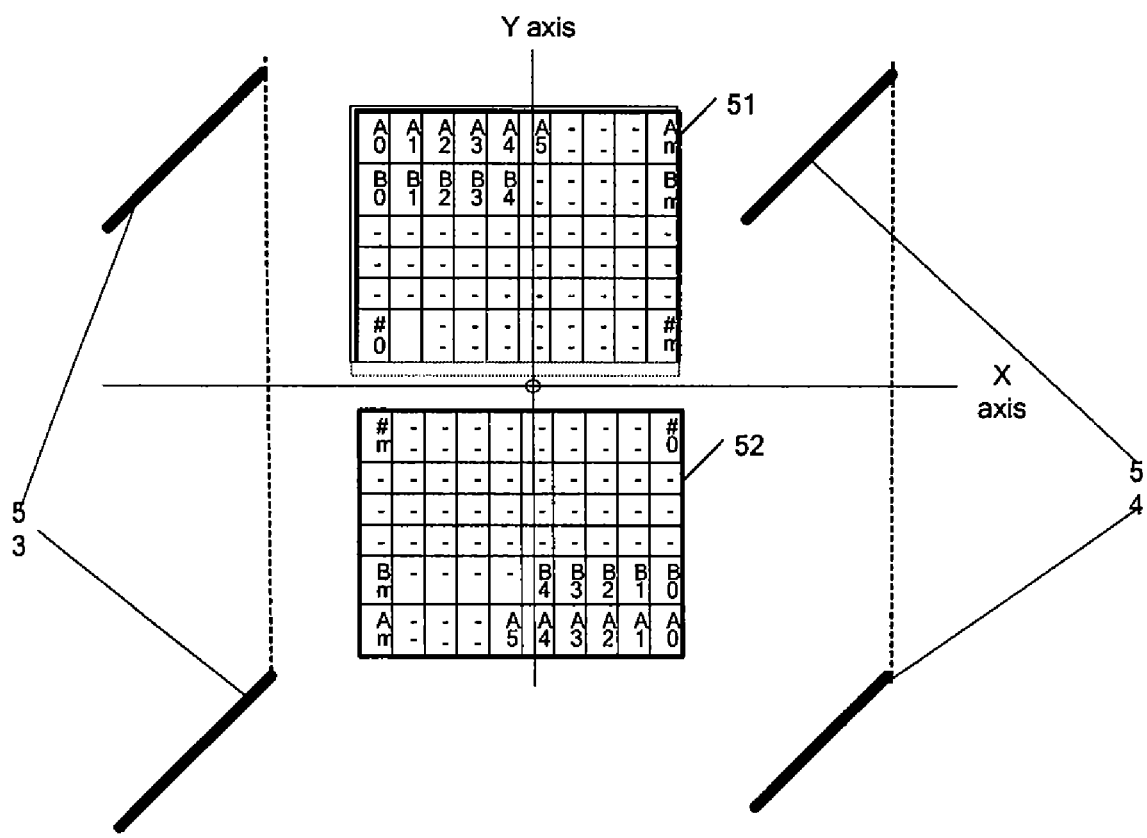
FIG. 5 illustrates the structure of a backplane in an embodiment of the present invention.

FIG. 5 illustrates the structure of a backplane in an embodiment of the present invention. The following describes the structure of the backplane with reference to FIG. 5.

At least one group of board connectors is set on the backplane. Each group of board connectors includes two board connectors that receive signals from different boards. For example, one board connector is adapted to receive signals of an active core board, and another board connector is adapted to receive signals of a standby core board. Each board connector includes connection terminals connected to the connector on boards. The two board connectors are distributed up and down, and the connection terminals of the two board connectors are centrosymmetric. In other words, the connection terminals of the two board connectors have a symmetrical arrangement of radiating parts about a center.

The connection terminals may be pins or slots. As shown in FIG. 5, the connection terminals are slots 51 and 52, and the connection terminals of the corresponding connectors on the boards are pins. Accordingly, if the connection terminals in a board connector on the backplane are pins, the connection terminals of the connector on the board are slots.

For example, if the connection terminals of each board connector are connected to each board through # rows and m columns of signal lines, and the board may be a core board or a peripheral board, and if there are two identical core boards A and B, and the signal lines connecting a board and the core board A are centralized in a first board connector on the backplane, viewed from left to right and from the top down, the connection terminals on the first board connector are laid out as shown in Table 1.

TABLE 1

| A0 | A1 | A2 | A3 | — | — | — | — | — | Am |
|----|----|----|----|---|---|---|---|---|-----|
| B0 | B1 | B2 | B3 | — | — | — | — | — | Bm |
| C0 | C1 | C2 | C3 | — | — | — | — | — | Cm |
| —  | —  | —  | —  | — | — | — | — | — | —   |
| —  | —  | —  | —  | — | — | — | — | — | —   |
| —  | —  | —  | —  | — | — | — | — | — | —   |
| —  | —  | —  | —  | — | — | — | — | — | —   |
| #0 | #1 | #2 | —  | — | — | — | — | — | #m  |

After the board connector rotates for 180 degrees around a center, the position of a second board connector that connects the board and the core board B, and the pin assignment of the connection terminals in the second board connector can be obtained. Viewed from left to right and from the top down, the connection terminals on the second board connector are laid out as shown in Table 2.

TABLE 2

| #m | — | — | — | — | — | — | — | #1 | #0 |
|----|---|---|---|---|---|---|---|----|----|
| —  | — | — | — | — | — | — | — | —  | —  |
| —  | — | — | — | — | — | — | — | —  | —  |
| —  | — | — | — | — | — | — | — | —  | —  |
| —  | — | — | — | — | — | — | — | —  | —  |
| —  | — | — | — | — | — | — | — | —  | —  |
| Cm | — | — | — | — | — | C3 | C2 | C1 | C0 |
| Bm | — | — | — | — | — | B3 | B2 | B1 | B0 |
| Am | — | — | — | — | A4 | A3 | A2 | A1 | A0 |

The positions of the first and second board connectors and the layout of the connection terminals on the backplane are the same as the positions of the corresponding connectors and the layout of the connection terminals on the board, before and after which rotate for 180 degrees around an axis through the center and perpendicular to the plane of the board connector. If the connector of the board is connected to one of the board connectors on the backplane, after the board rotates for 180 degrees around the axis, the connector on the board can be connected to another board connector of the backplane.

To save space of the backplane, the center may be the intersection point between perpendicular line 1 and perpendicular line 2, where perpendicular line 1 is the central line of inserting the board onto the backplane vertically, and perpendicular line 2 is the central line of the two board connectors.

The board designed to work with the foregoing backplane includes a function processing unit circuit and a connector. The connector has connection terminals. The board can be connected to one of the board connectors on the backplane directly through the connector. After being reversed, the board can be connected to another board connector on the backplane through the connector.

The board has no a dual-transmit single-receive unit circuit, the cost of the board is lower. The connection terminals in the board connector on the backplane are centrosymmetric, the board can be inserted into different board connectors on the backplane after the board is reversed. Therefore, there are no requires of designing two different boards, and the cost of development, production and maintenance of the board is reduced. In a word, for the boards that do not need to receive signals from two boards concurrently, the cost can be slashed and the resources can be saved.

To facilitate the connection between the board connector and the corresponding connector on the backplane, one or more board slots may be set on the backplane. Each board slot can have a left trough and a right trough. As shown in FIG. 5, the left trough 53 and the right trough 54 are centered on the foregoing center symmetrically. After the left trough 53 and the right trough 54 are determined, a horizontal axis "X axis" can be determined by taking a central point of the vertical slot in the vertical direction on the backplane. One of the board connectors on the backplane according to one of the core boards is set above the X axis, a vertical axis "Y axis" can be determined by taking a central point of the board connector in the horizontal direction, and the center can be determined by taking the intersection between the X axis and the Y axis. After the board connector rotates for 180 degrees around the center, the position of the board connector and the pin assignment of the connection terminals according to another core board are obtained. It is evident that the two groups of connection terminals are distributed symmetrically around the foregoing center.

To prevent misoperation, components such as anti-misoperation sockets can be set on the backplane, and such components should also be distributed symmetrically around the center.

To facilitate board insertion, components such as a panel label and indicators can be set on the backplane. Such components should also be distributed symmetrically around the center.

As seen above, the connection terminals in each group of two board connectors on the backplane are distributed in a centrosymmetric way, and the connector on the board may be connected to one of the board connectors on the backplane. After the board rotates for 180 degrees around the axis through the center and perpendicular to the plane of the board connector, the board connector may be connected to another board connector of the backplane. In this way, the board can be connected to the two board connectors of the backplane through only one connector. When the board needs to process signals of only one board on the backplane, only one function processing unit circuit needs to be designed, without requiring two different boards to be adaptable to a group of board connectors on the backplane, thus slashing the cost of development, production and maintenance and saving resources.

The backplane provided in an embodiment of the present invention is introduced in detail above from one aspect of the present invention. For better understanding and implementation of the present invention, a communication apparatus including a foregoing backplane is described below from another aspect of the present invention.

Figure 6:
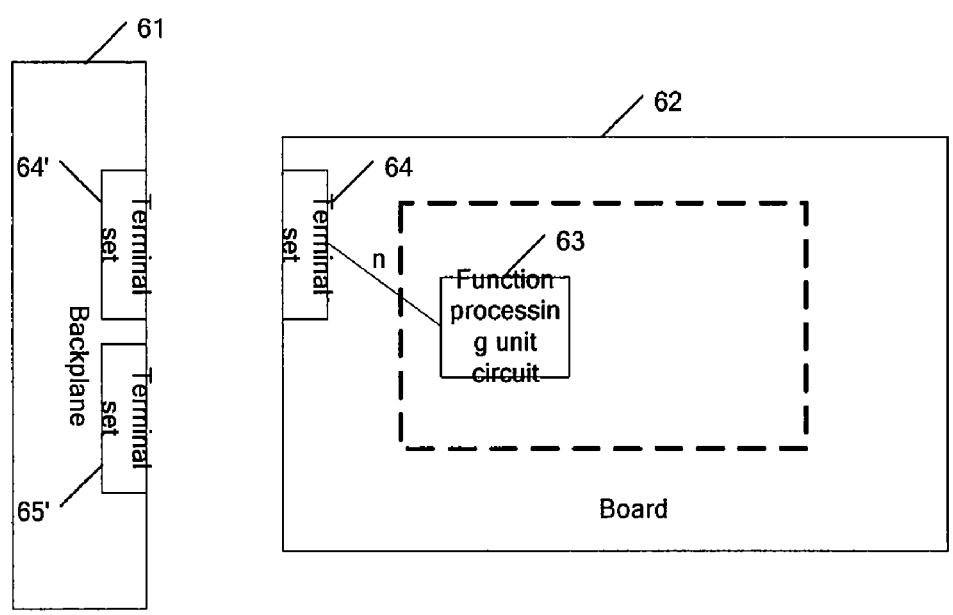
FIG. 6 illustrates the structure of a communication apparatus in an embodiment of the present invention.

FIG. 6 illustrates the structure of a communication apparatus in an embodiment of the present invention. The communication apparatus includes a backplane 61, and one or more boards 62. The board 62 includes a function processing unit circuit 63, and a connector. The connector referred to in this embodiment is a terminal set 64 with multiple connection terminals.

At least one group of board connectors is set on the backplane 61. Each group of board connectors has two board connectors, for example, terminal set 64' and terminal set 65' shown in FIG. 6. Each board connector has connection terminals connected to the connector of the board 62. The two board connectors on the backplane 61 are distributed up and down, and the connection terminals of the two board connectors are centrosymmetric. In other words, the connection terminals of two board connectors have a symmetrical arrangement of radiating parts about a center.

The connection terminals may be slots or pins. For example, if the signal terminals in the connector on the board 62 are pins, the connection terminals in the board connector on the backplane 61 are slots. The board 62 can be inserted into the slot in one of the board connectors on the backplane 61 directly through the pin in the connector 64, for example, connector 64'. After the board rotates for 180 degrees around the axis through the center and perpendicular to the plane of the board connector, the connection terminals of another connector 65' can be inserted.

The board 62 in the communication apparatus described above has no dual-transmit single-receive unit circuit. Therefore, for a board that does not need to process signals from two different boards concurrently, the cost is reduced. Moreover, the positions of the connectors on the backplane 62 and the connection terminals therein are distributed in a centrosymmetric way. Therefore, for a board that receives signals from different boards, it is unnecessary to design different boards, thus reducing the cost of design, development, and maintenance of the board.

Preferably, to save space of the backplane 61, the center may be the intersection point between perpendicular line 1 and perpendicular line 2, where perpendicular line 1 is the central line of inserting the board 62 onto the backplane 61 vertically, and perpendicular line 2 is the central line of the two board connectors.

To facilitate the connection between the board connector on the backplane 61 and the corresponding connector on the board 62, one or more board slots may be set on the backplane 61. Each board slot can has a left trough and a right trough. The two troughs are centered on the foregoing center symmetrically. After the left trough and the right trough are determined, a horizontal axis "X axis" can be determined by taking a central point of the vertical slot in the vertical direction on the backplane 61. One of the board connectors on the backplane 61 according to one of the board 62 (herein is a core board) is set above the X axis, a vertical axis "Y axis" can be determined by taking a central point of the board connector in the horizontal direction, and the center can be determined by taking the intersection between the X axis and the Y axis. After the board connector rotates for 180 degrees around the center, the position of the board connector and the pin assignment of the connection terminals according to another board 62 (herein is a core board) are obtained. It is evident that the two groups of connection terminals are distributed symmetrically around the foregoing center.

To prevent misoperation, components such as anti-misoperation connectors can be set on the board, and such components should also be distributed symmetrically around the center.

To facilitate board insertion, components such as a panel label and indicators may be set on the backplane. Such components should also be distributed symmetrically around the center.

The foregoing are only preferred embodiments of the invention and are not for use in limiting the protection scope thereof. Any modification, equivalent replacement and improvement within the spirit and principle of this invention shall be covered in the scope defined by the appended claims.

What is claimed is:

1. A backplane comprising:
    at least one group of board connectors, wherein
    each group of the board connectors comprises two board connectors that receive signals from different boards; and
    each of the board connectors comprises connection terminals connected to a connector on a board, the two board connectors are distributed in one board slot and adjacent to each other, and the connection terminals of the two board connectors are distributed symmetrically around a center.

2. The backplane according to claim 1, wherein after one board connector is connected to the connector on the board and the board is rotated by 180 degrees around an axis through the center and perpendicular to the plane of the board connector, the connector on the board can be connected to another board connector of the backplane.

3. The backplane according to claim 1, wherein the center is the intersection point between a first perpendicular line and a second perpendicular line, where the first perpendicular line is the central line of inserting the board onto the backplane vertically, and the second perpendicular line is the central line of the two board connectors.

4. The backplane according to claim 1, wherein the backplane further comprises one or more components of anti-misoperation sockets, panel labels, and indicators, and said components are distributed symmetrically around the center.

5. The backplane according to claim 1, wherein the board slot has left trough and right trough, which are centered on the center symmetrically.

6. A communication apparatus comprising:
    one or more board and a backplane, wherein
    each of the one or more board comprises a connector and a function processing unit circuit connected to the connector;
    the backplane comprises at least one group of board connectors;
    each group of the board connectors comprises two board connectors that receive signals from different boards, each of the board connectors comprises connection terminals connected to another connector on the one or more board, the two board connectors are distributed in one board slot adjacent to each other, and the connection terminals of the two board connectors are distributed symmetrically around a center.

7. The communication apparatus according to claim 6, wherein after one board connector is connected to the another connector on each of the one or more board and each of the one or more board is rotated by 180 degrees around an axis through the center and perpendicular to the plane of the board connector, the connector on the board can be connected to another board connector of the backplane.

8. The communication apparatus according to claim 6, wherein the center is the intersection point between a first perpendicular line and a second perpendicular line, where the first perpendicular line is the central line of inserting the board onto the backplane vertically, and the second perpendicular line is the central line of the two board connectors.

9. The communication apparatus according to claim 6, wherein the backplane further comprises one or more components of anti-misoperation sockets, panel labels, and indicators, and said components are distributed symmetrically around the center.

10. The communication apparatus according to claim 6, wherein the each board slot has left and right trough, which are centered on the center symmetrically.

\* \* \* \* \*